United States Patent [19]

Harnden et al.

[11] Patent Number: 5,795,405
[45] Date of Patent: Aug. 18, 1998

[54] MACHINE AND METHOD FOR PROCESSING OF PRINTED CIRCUIT BOARDS BY IMMERSION IN TRANSVERSELY FLOWING LIQUID CHEMICAL

[75] Inventors: Eric F. Harnden, 1030 Berne Dr., Crestine, Calif. 92325; Daryl K. Ito, Bristol, Wis.

[73] Assignee: Eric F. Harnden, Redlands, Calif.

[21] Appl. No.: 614,661

[22] Filed: Mar. 13, 1996

[51] Int. Cl.$^6$ .................................................. B08B 3/04
[52] U.S. Cl. ........................ 134/25.4; 134/32; 134/67; 134/134; 134/64 R; 134/902; 198/407
[58] Field of Search ........................ 134/62, 61, 73, 134/74, 75, 134, 902, 64 R, 32, 67, 83, 25.4; 118/423, 425; 198/413, 407, 410

[56] References Cited

U.S. PATENT DOCUMENTS

| | | |
|---|---|---|
| 657,323 | 9/1900 | Thickins . |
| 1,876,050 | 9/1932 | Fox . |
| 2,066,628 | 1/1937 | Larson et al. ............... 198/407 |
| 2,715,975 | 8/1955 | Doane et al. ............... 198/407 |
| 2,750,923 | 6/1956 | Daniel . |
| 2,820,754 | 1/1958 | Brower . |
| 3,236,680 | 2/1966 | Hnot . |
| 3,516,345 | 6/1970 | Meyer ............... 134/64 R |
| 3,601,090 | 8/1971 | Vallon ............... 118/423 |
| 3,768,493 | 10/1973 | Kraeft ............... 134/46 |
| 3,815,617 | 6/1974 | Faust ............... 134/133 |
| 3,868,272 | 2/1975 | Tardoskegyi ............... 134/26 |
| 4,196,023 | 4/1980 | Rowe ............... 148/6.15 |
| 4,233,084 | 11/1980 | Bergsand ............... 134/67 |
| 4,263,122 | 4/1981 | Urquhart ............... 294/300 |
| 4,268,206 | 5/1981 | Johnson ............... 414/222 |
| 4,282,825 | 8/1981 | Nagatomo et al. ............... 118/58 |
| 4,408,560 | 10/1983 | Caratsch ............... 134/902 |
| 4,458,703 | 7/1984 | Inoue et al. ............... 134/902 |
| 4,475,259 | 10/1984 | Ishii et al. ............... 134/902 |
| 4,566,951 | 1/1986 | Norberg et al. ............... 134/64 R |
| 4,589,926 | 5/1986 | Holmstrand et al. ............... 134/902 |
| 4,722,355 | 2/1988 | Moe et al. ............... 134/73 |
| 4,745,004 | 5/1988 | Schwerin ............... 427/96 |
| 4,828,878 | 5/1989 | Mankut et al. ............... 134/902 |
| 4,966,672 | 10/1990 | Levit et al. ............... 204/198 |
| 5,064,051 | 11/1991 | Blundy ............... 198/413 |
| 5,186,600 | 2/1993 | Wokeck et al. ............... 414/793.4 |
| 5,248,340 | 9/1993 | Nakagawa et al. ............... 118/422 |
| 5,297,568 | 3/1994 | Schmid ............... 134/64 R |
| 5,417,829 | 5/1995 | Zecher ............... 204/214 |

FOREIGN PATENT DOCUMENTS

| | | | |
|---|---|---|---|
| 526245 | 2/1993 | European Pat. Off. ............... | 134/902 |
| 096506 | 3/1980 | Japan . | |
| 4-61231 | 2/1992 | Japan . ............... | 134/902 |

Primary Examiner—Frankie L. Stinson
Attorney, Agent, or Firm—Oppenheimer Poms Smith

[57] ABSTRACT

An apparatus for chemically treating the surfaces of printed circuit board work pieces (PCBWP's) includes a tank for holding a bath of the chemical treatment liquid. A receiving device is provided for receiving the PCBWP's from a conventional transport conveyor in a horizontal orientation, and immersing the PCBWP's into the bath in a substantially vertical orientation. A conveyor device in the tank is configured to hold the PCBWP's in the vertical orientation and to move them face-on through the liquid bath while a substantially uniform transverse flow of fresh liquid is provided between the work pieces. Another conveyor device receives the PCBWP's and elevates them out of the bath in the vertical orientation, subsequently returning them to a horizontal orientation for delivery to a conventional transport conveyor.

41 Claims, 7 Drawing Sheets

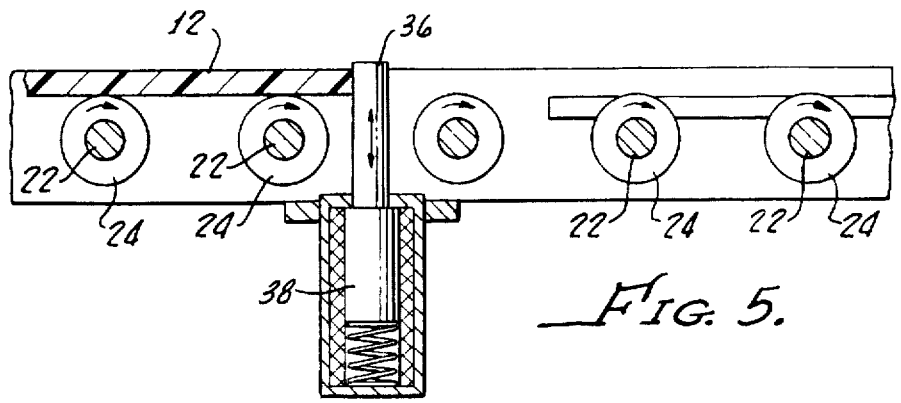
FIG. 5.
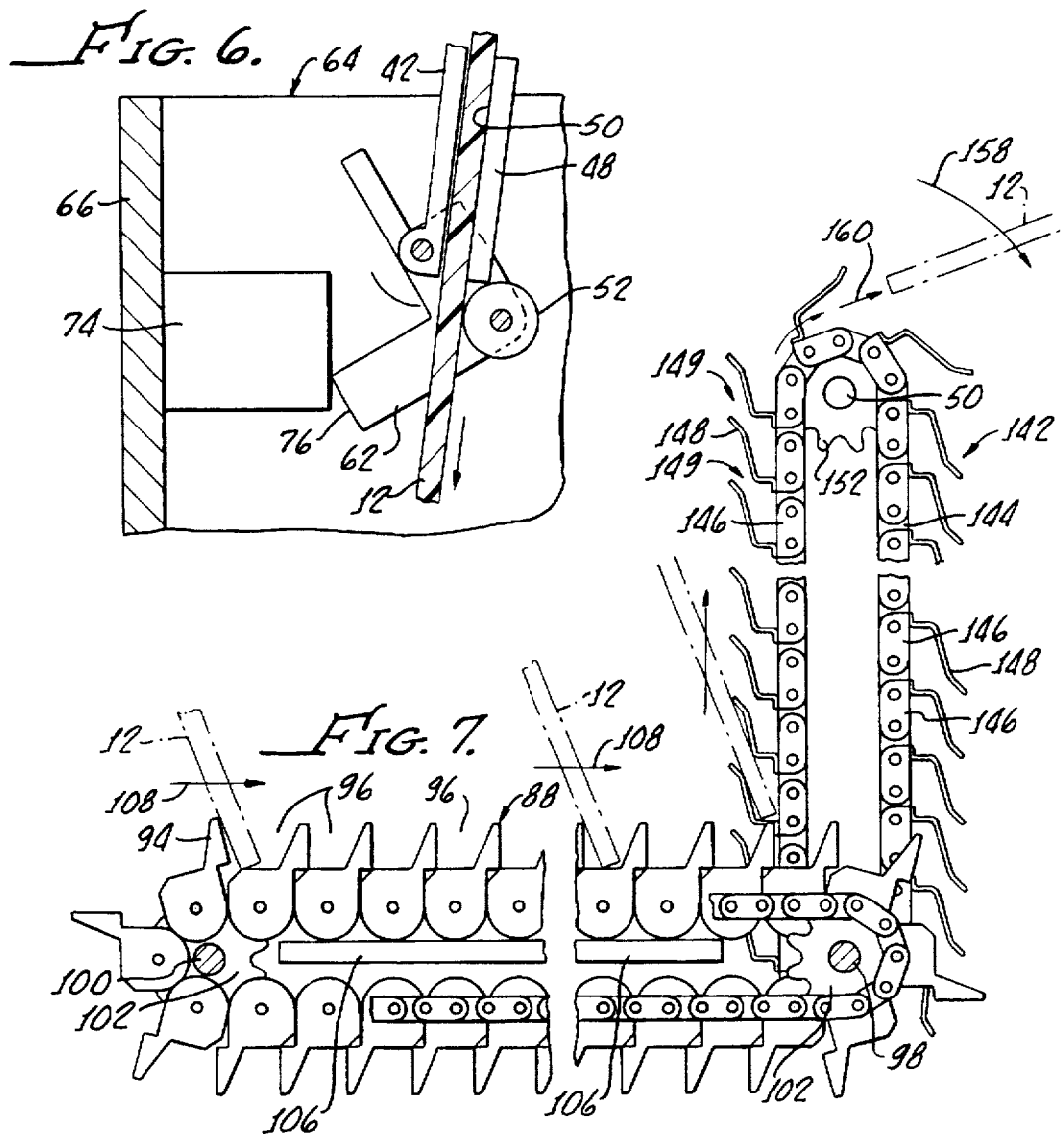
FIG. 6.
FIG. 7.

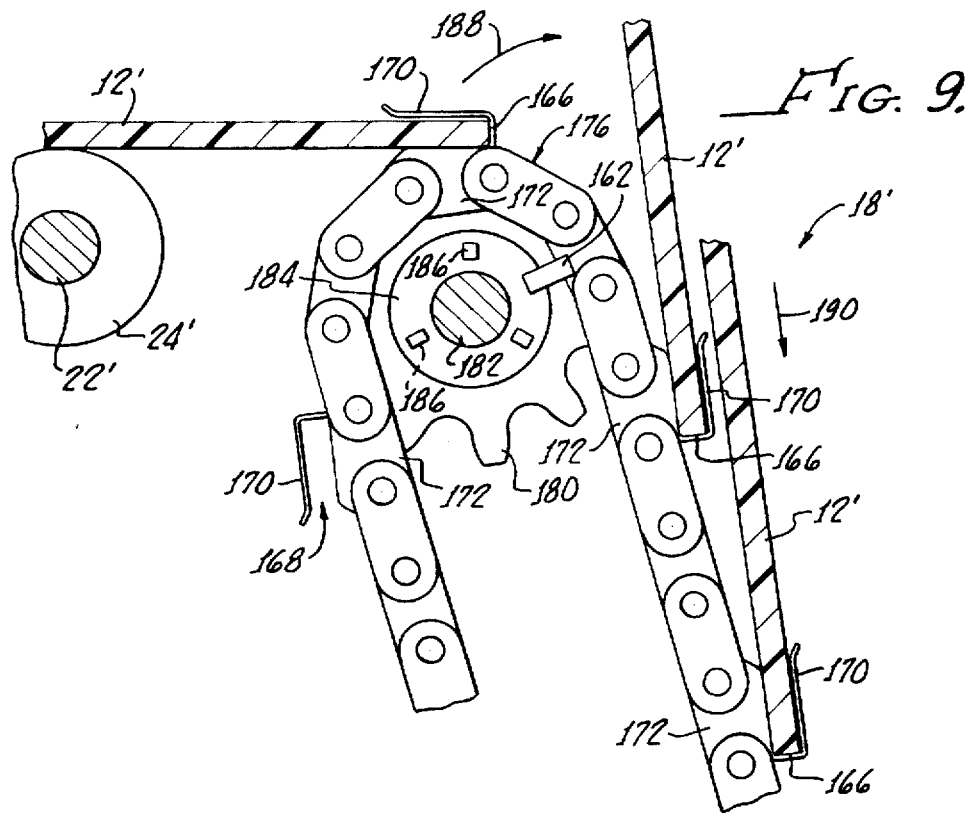
FIG. 9.
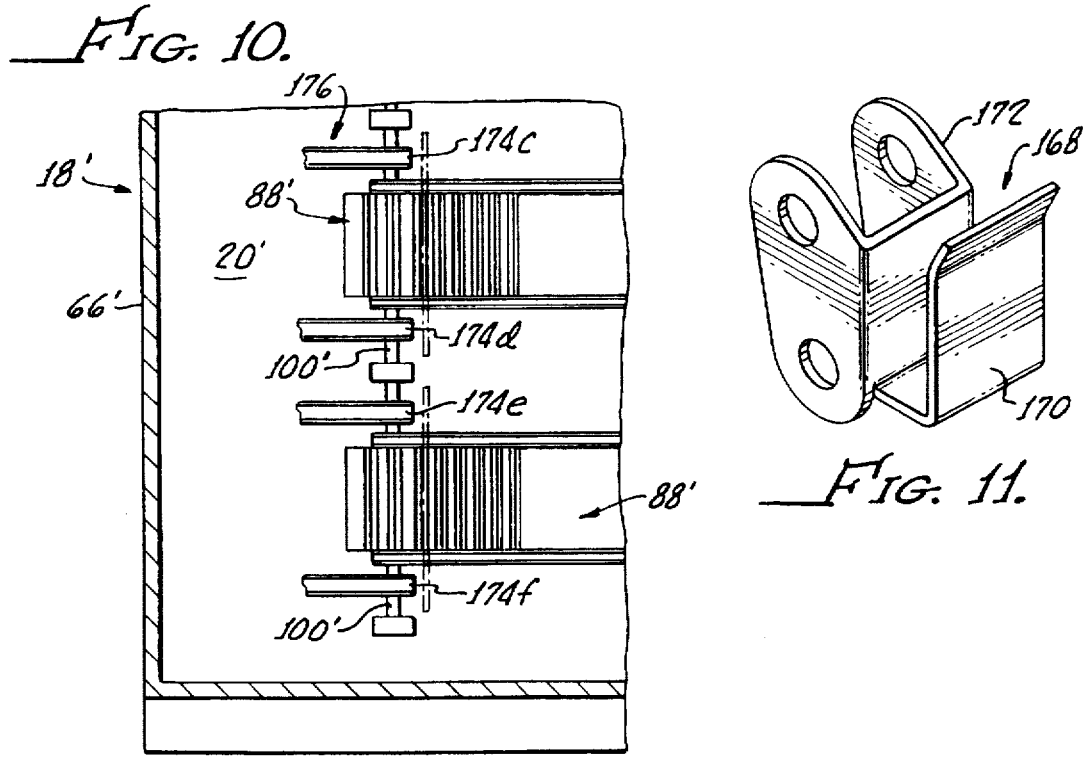
FIG. 10.
FIG. 11.

MACHINE AND METHOD FOR PROCESSING OF PRINTED CIRCUIT BOARDS BY IMMERSION IN TRANSVERSELY FLOWING LIQUID CHEMICAL

BACKGROUND OF THE INVENTION

1. Field of the Invention

This invention is in the field of machines and methods for processing printed circuit boards by immersing work pieces (which will become the printed circuit boards) into a selected chemical liquid. The chemical liquid treats the surfaces of the work pieces, including both planar surfaces and surfaces within through holes, so that respective conductive traces and vias may be created on the planar surfaces and in the through holes by subsequent processing steps.

2. Related Technology

U.S. Pat. No. 1,876,050, issued 6 Sep. 1932, is believed to relate to an apparatus for automatically dipping sheet-like work pieces, such as sheet metal members. In the '050 patent, it appears as though the work pieces are folded over, or hand over horizontal shafts which traverse along guide tracks, and are powered in this movement by a pair of conveyor chains. The pair of conveyor chains engage opposite ends of the horizontal shafts, and rollers are provided to allow the work-carrying horizontal shafts to move along the guide tracks.

U.S. Pat. No. 3,601,090, issued 24 Aug. 1971, is believed to relate to a device for coating or impregnating sheet material, such as cardboard or felt, with an impregnation product, which is kept in the liquid state during impregnation or coating of the sheet material. The device includes a tank having inclined end walls, and a pair of chain conveyors extending through this tank for holding the sheet material in a vertical orientation while it moves through the liquid material in the tank.

U.S. Pat. No. 4,408,560, issued 11 Oct. 1983 is believed to disclose an apparatus for applying solder to printed circuit boards. In this apparatus, a liquid application station passes the boards in a horizontal orientation through an application liquid. Next, the printed circuit boards are passed through an activation station for activation of the application liquid. Upon next arriving at a receiver station, the printed circuit boards are received into a U-shaped receiver element, which pivots about a horizontal axis into a vertical transfer position. Grippers then transfer the printed circuit board to a solder bath, and then into another receiver element. The second receiver element returns the printed circuit board to a horizontal orientation.

U.S. Pat. No. 4,828,878, issued 9 May 1989, is believed to relate to a device for treating printed circuit boards. The '878 patent appears to disclose a treatment container for receiving liquid treatment material. A tilting mechanism moves the printed circuit boards from a horizontal orientation to a vertical orientation preparatory to immersion of the printed circuit board into the treatment liquid. A conveyor of object supports appears to include a horizontal rail extending the length of the treatment tank, and along which object supports move. The printed circuit boards may apparently hang into the treatment liquid by the use of clamps attached to the object supports. After completing a trip along the conveyor rail, the object supports are returned along an upper horizontal plane to a starting position for receiving another printed circuit board, and the treated printed circuit boards are returned to their horizontal orientation by another tilting mechanism for further processing.

Finally, U.S. Pat. No. 5,297,568, issued 29 Mar. 1994 is believed to relate to an apparatus for treatment of printed circuit boards using liquid treatment materials. In the device disclosed by the '568 patent, printed circuit boards are moved in a horizontal orientation along a conveyor line above a liquid catch tank while liquid treatment material is sprayed upwardly against the lower surface of the printed circuit board. The printed circuit board then reaches a turn-over station, in which it is inverted top-to-bottom. Next, liquid treatment material is again sprayed against the lower surface of the printed circuit board, which lower surface was the upper surface in the first section of treatment. Subsequently, the printed circuit boards, still in the horizontal orientation, pass into a station in which liquid treatment material is sprayed against both upper and lower surfaces of the boards. In this device, the printed circuit boards are treated only in the horizontal orientation, and must be turned over so that both surfaces of the printed circuit boards can be treated.

In view of the above, it can be seen that devices and methods according to the conventional technology for treating the surfaces of printed circuit board work pieces with liquid treatment material require one or more of: a considerable floor space for the apparatus, involve use of complicated conveyor mechanisms, or require the use of high-pressure pumps for the liquid chemical treatment material.

SUMMARY OF THE INVENTION

In view of the above, a primary object for this invention is to avoid one or more of the deficiencies of the conventional technology.

Another object for this invention is to provide a device for immersion treatment of printed circuit board work pieces with a chemical treatment liquid.

Still another object for this invention is to provide such a treatment device which will receive and discharge printed circuit board work pieces in the conventional horizontal orientation.

Yet another object for this invention is to provide such a treatment device which advances immersed printed circuit board work pieces generally perpendicularly to their own plane through the chemical treatment liquid in order to promote flow of the liquid through any holes, or apertures of the work piece.

Another object for this invention is to provide such a treatment device in which a transverse flow of chemical treatment liquid is maintained past the immersed printed circuit board work pieces in order to bring fresh and reactive treatment liquid to the surfaces of the immersed work pieces.

Another object for this invention is to provide such a chemical treatment device for treating the surfaces of printed circuit board work pieces in which the work pieces are elevated out of the chemical treatment bath and reoriented to a horizontal position by a single elevator mechanism, so that a separate reorienting mechanism is not required.

Accordingly, the present invention provides an apparatus for chemically treating the surfaces of a panel-like planar printed circuit board work piece (PCBWP), the apparatus including receiving means for receiving a PCBWP in a horizontal orientation and moving the PCBWP to a substantially vertical orientation; tank means for holding a bath of chemical treatment liquid; immersion means for moving the PCBWP in the substantially vertical orientation from the receiving means into the bath of chemical treatment liquid; conveyor means submerged in the bath of chemical treatment liquid for supporting and moving the PCBWP in the substantially vertical orientation horizontally along the tank substantially perpendicularly to the plane of the PCBWP; elevator means for receiving the PCBWP from the conveyor means and elevating the PCBWP in the substantially vertical orientation upwardly out of the bath of chemical treatment liquid.

An advantage of the present invention is that the liquid level in the tank is below the level of the printed circuit board work pieces as they move along a delivery conveyor and removal conveyor of the processing line for these work pieces. Consequently, liquid dams and locks for allowing the work pieces to enter or depart from liquid baths having a level above the horizontal level of conveyance of the work pieces are not necessary. Further, synchronization of the treatment device with a delivery conveyor for the work pieces is substantially not necessary. Still further, because the work pieces are advanced through the liquid chemical bath in a face-on orientation (i.e., substantially perpendicular to their own plane), their own movement through the bath urges flow of chemical liquid through any through holes of the work pieces. Finally, the device maintains a transverse substantially uniform liquid flow field delivering fresh chemical treatment liquid to the surfaces of the work pieces. A comparatively low-power consumption is required for this liquid circulation because the device uses a liquid-jet eductor type of pump.

BRIEF DESCRIPTION OF THE DRAWING FIGURES

FIG. 1 provides a somewhat diagrammatic side elevation view (partly in cross section) of a delivery conveyor line, a treatment device for receiving printed circuit board work pieces from the delivery conveyor line, immersing the printed circuit board work pieces in a treatment liquid, elevating the printed work pieces out of the treatment liquid, and delivering the work pieces to a removal conveyor;

FIG. 2 provides a partially schematic plan view of the apparatus seen in FIG. 1 with a cover portion of the device removed to better illustrate internal details of the device;

FIG. 3 is a diagrammatic perspective view of a portion of the treatment device seen in FIGS. 1 and 2;

FIG. 4 provides a perspective view, partially in phantom lines for clarity of illustration, of a portion of the device seen in FIGS. 1–3;

FIG. 5 is an enlarged fragmentary and somewhat diagrammatic view of a portion of the device seen in FIGS. 1, 2, and 3;

FIG. 6 is another enlarged view like that of FIG. 5, but showing an operative portion of the machine in an alternative position;

FIG. 7 is yet another enlarged fragmentary view of a portion of the device seen in FIGS. 1 and 2;

Figure 8:
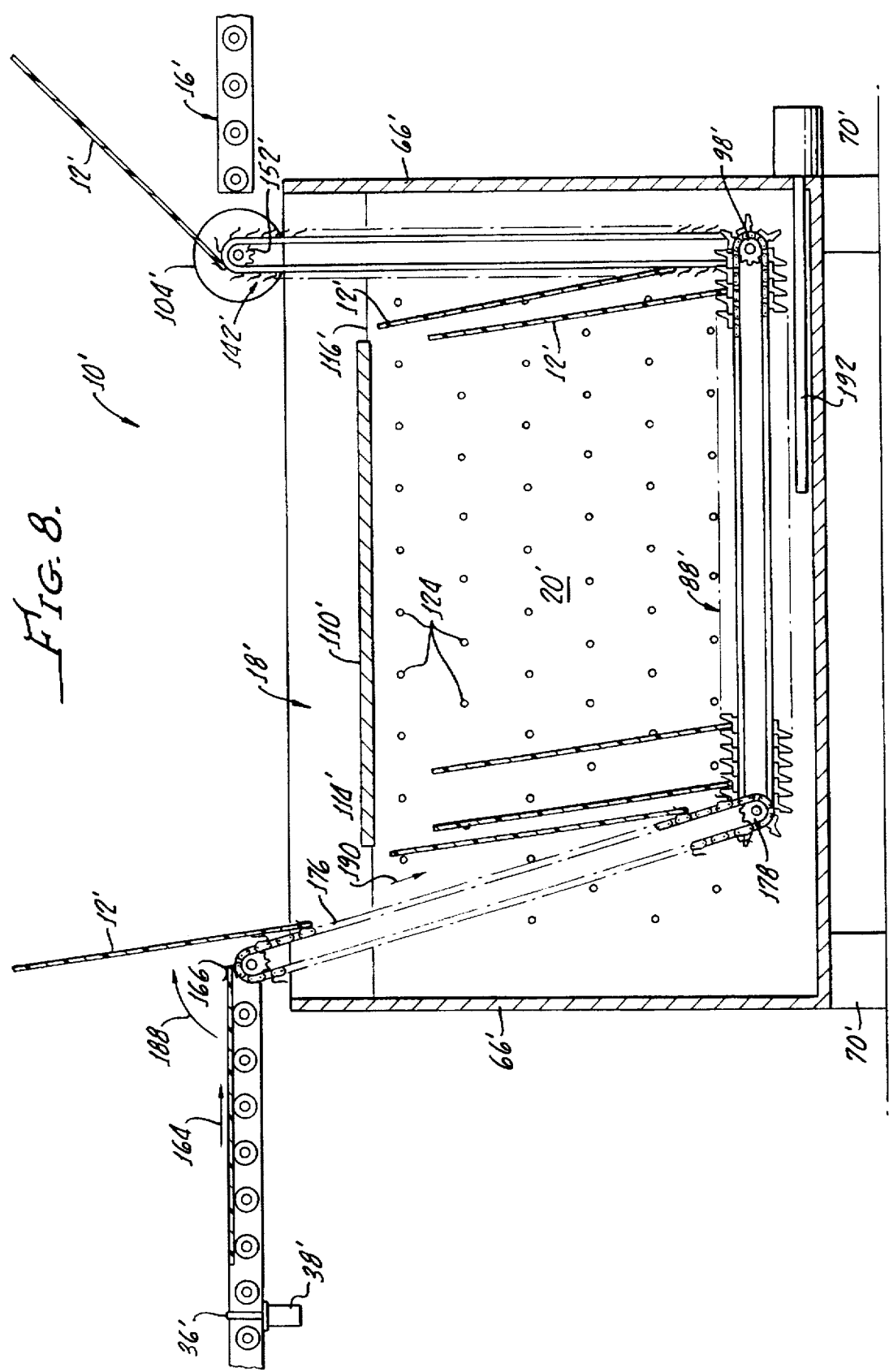

FIG. 8 provides a side elevation view (partly in cross section similar to FIG. 1), but showing an alternative embodiment of the invention;

FIG. 9 provides an enlarged and somewhat diagrammatic side elevation view of an immersion conveyor portion of the machine seen in FIG. 8;

FIG. 10 provides a fragmentary plan view of a portion of the device seen in FIGS. 8 and 9; and FIG. 11 provides an enlarged perspective view of a portion of the device seen in FIGS. 8–10.

DETAILED DESCRIPTION OF TWO EXEMPLARY PREFERRED EMBODIMENTS OF THE INVENTION

Figure 1:
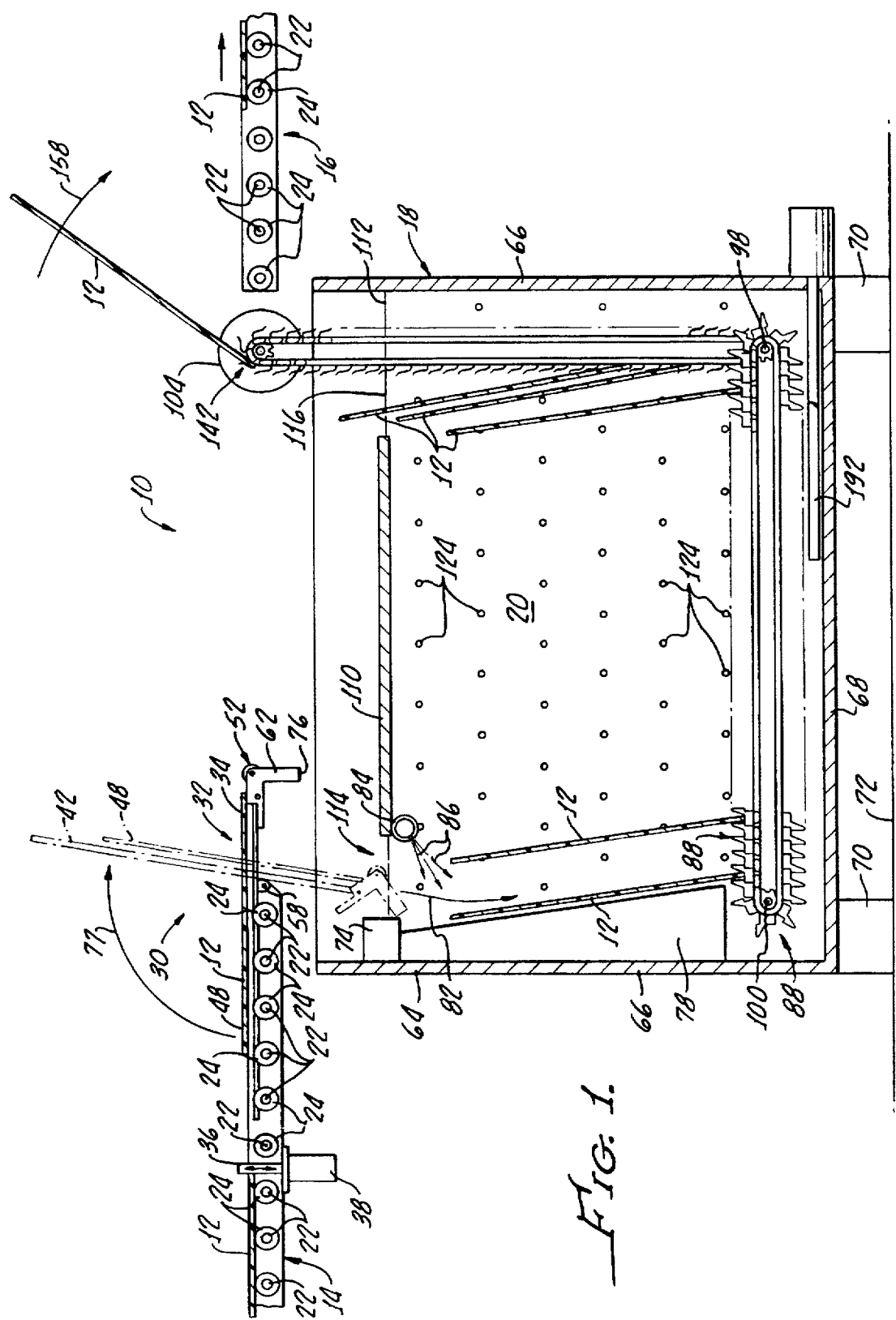
Figure 2:
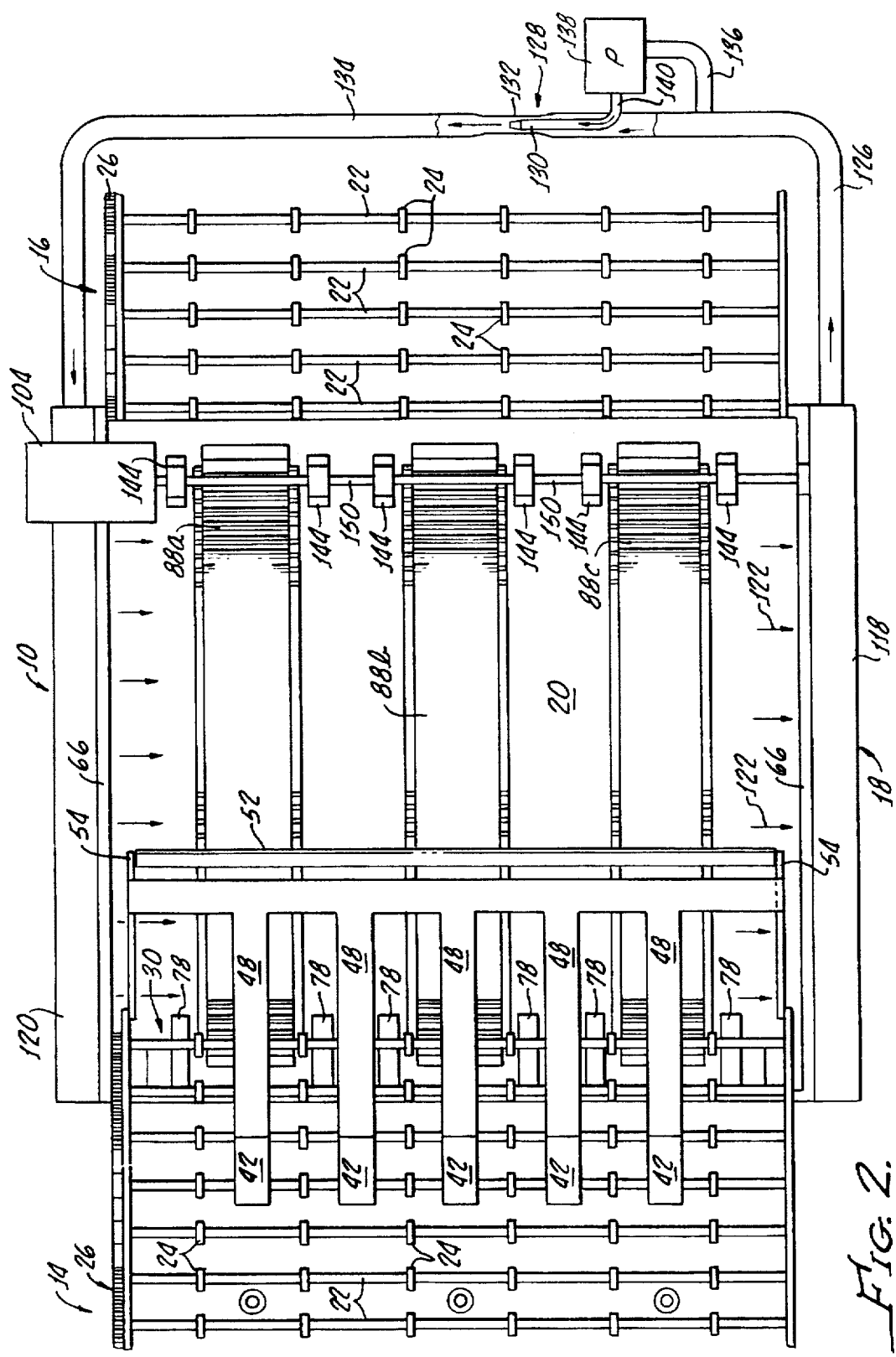

Considering first FIGS. 1 and 2 in conjunction, the relevant liquid chemical immersion surface treatment portion 10 of a processing or manufacturing line is depicted. The complete processing line (not shown) is for processing printed circuit board work pieces 12 (hereinafter PCBWP's) to make completed printed circuit boards. Those ordinarily skilled in the pertinent arts will understand that such printed circuit boards have an insulative planar board-like substrate upon which and within which conductive traces and vias are formed to define electrical circuits in conjunction with integrated and/or discrete circuit devices and other components (such as connectors) which are combined with the printed circuit board. The immersion surface treatment portion 10 of the manufacturing line is shown in side elevation and plan views in FIGS. 1 and 2, respectively, with some features broken away or shown in phantom lines for clarity of illustration. Additionally, the treatment portion 10 is illustrated foreshortened in the length direction along the manufacturing line for convenience in illustration. Further, a convention is observed in the following description with respect to the terms "right" and "left", which are used with respect to the direction of progress of work pieces 12 along the manufacturing line. Thus, a view from the right-hand side of the treatment portion 10 is seen in FIG. 1, with movement of the work pieces in this view being from left to right.

It will be well understood by those ordinarily skilled in the pertinent arts that other conventional parts of the processing or manufacturing line conduct additional manufacturing operations both before and after the portion 10 in order to produce finished printed circuit boards from the PCBWP's 12. Generally, these PCBWP's 12 are planar, relatively thin (i.e., in the range from about 0.054 to 0.250 inch thick), panel-like structures. The PCBWP's may have one or more layers of fiberglass or phenolic material, for example, layered with conductive traces and other features to which integrated and discrete circuit components may be soldered or otherwise attached. Usually, the conductive features of a printed circuit board are formed of metal foil, metal electroplate, or electroless deposited metal. Additionally, it will be understood that the PCBWP's may each provide one or more finished printed circuit boards. That is, the finished printed circuit boards will be separated out of the PCBWP's by cutting, shearing, or stamping, for example. As such, the PCBWP's may range from about 6 inches wide to as much as 24 inches or more in width. In length, the PCBWP's may similarly range from about 6 inches to about 36 inches. Desirably, the portion 10 of the manufacturing line, as well as all other component parts of this line, will handle PCBWP's of various sizes substantially without need for adjustment. Consequently, PCBWP's of various sizes and configurations desirably can be processed while mixed together. In the case of PCBWP's of a size less than 24 inches in width, these may be processed in parallel ranks of two or more PCBWP's abreast.

The chemical liquid immersion surface treatment portion 10 of the processing or manufacturing line includes both a conventional delivery conveyor 14 and a conventional removal conveyor 16, both of which are associated with a chemical liquid immersion surface treatment device 18 to be further explained. Both of these conventional conveyors 14 and 16 handle the PCBWP's in an edge-on horizontal orientation. The delivery conveyor 14 delivers the PCBWP's to the chemical liquid immersion surface treatment device 18 in this horizontal orientation. As will be seen, the device 18 accepts the PCBWP's in the edge-on horizontal orientation, moves the PCBWP's to a face-on substantially vertical orientation while immersing these work pieces in a chemical liquid bath, further moves the work pieces in a face-on substantially vertical orientation through the chemical liquid bath while maintaining a transverse flow of fresh chemical liquid across the major surfaces of the PCBWP's, elevates the work pieces out of the chemical liquid bath, moves the PCBWP's once again to an edge-on horizontal orientation, and delivers the work pieces to the removal conveyor 16.

Considering the treatment device 18, it will be seen that in general this device includes facilities or mechanisms for: receiving the PCBWP's 12 individually in the horizontal orientation from the delivery conveyor 14; for reorienting the PCBWP's 12 individually into a vertical orientation; for immersing the PCBWP's 12 in a treatment liquid 20; and for maintaining the work pieces 12 each for a determined residence time in this treatment liquid 20 while moving the PCBWP's 12 generally perpendicularly to their own plane through the treatment liquid 20 to promote flow of the treatment liquid through any apertures and holes of the PCBWP's 12, and while also maintaining a large-volume, low-pressure transverse flow of the treatment liquid 20; for elevating the PCBWP's 12 out of the treatment liquid 20; and finally for returning the PCBWP's 12 to the horizontal orientation and simultaneously delivering the PCBWP's 12 to the removal conveyor 16.

Figure 3:
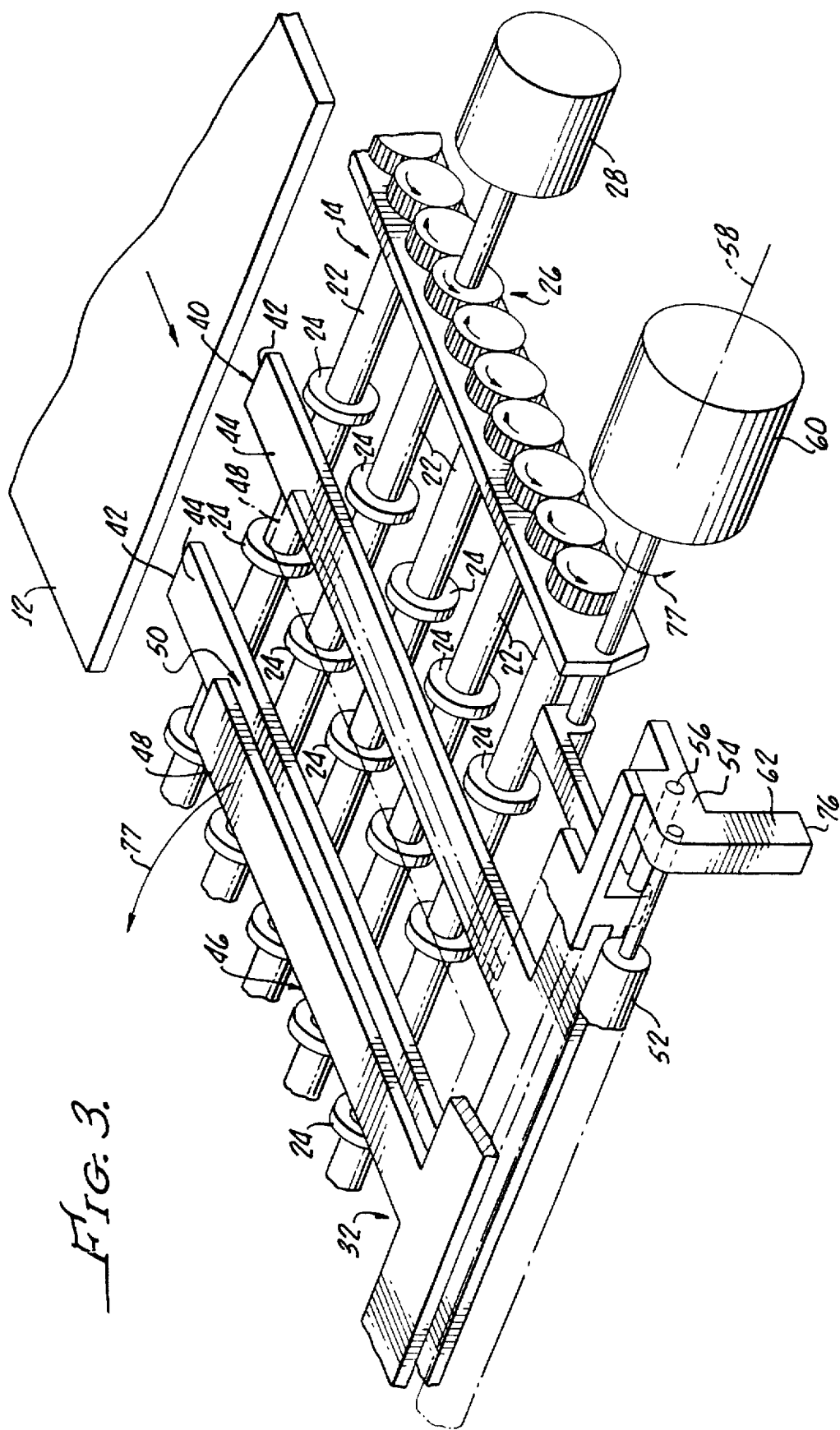

In view of the above, attention now more particularly to FIG. 2 will show that the conventional delivery conveyors 14 and 16 each include a linear array of parallel powered shafts 22, with each shaft carrying several spaced apart conveyor wheels 24. FIG. 3 shows a fragmentary part of the delivery conveyor 14, which is typical of such conventional conveyors. By way of example only, the shafts 22 may be linked by a train of spur gears 26, with power for the conveyor wheels 24 being provided by a drive motor 28 (best seen in FIG. 3). Alternatively, the shafts 22 may be drivingly linked by a system of drive belts. However, these drive features for the conveyors 14 and 16 are well known, and will not be considered further. The PCBWP's 12 rest solely by their own weight upon the conveyor wheels 24 so that these conveyor wheels 24 cooperatively support and frictionally propel the PCBWP's as they are moved along the conveyors 14 and 16. For this purpose, the conveyor wheels 24 may include a conventional resilient elastomeric peripheral tread, although this is not required. As the PCBWP's proceed toward a termination portion 30 of the delivery conveyor 14, which portion is seen at the left-hand side of FIGS. 1 and 2, they successively enter a receiving and tilting mechanism 32 of the treatment device 18.

Viewing the receiving and tilting mechanism 32 (best seen in FIG. 3 where it is illustrated as viewed from the left-hand side of the device 18, and with attention to FIGS. 1 and 2 also), it is seen that this mechanism 32 is coextensive with the termination portion 30 of the delivery conveyor 30 and includes a rather open fork-like receiving and tilting member 34. As is seen in FIGS. 1 and 5, a blocking member 36 (which may be rake-like with several upstanding transversely aligned tines) is extensible upwardly into the path of the PCBWP's moving along the delivery conveyor 14. This blocking member 36 is extended and retracted (as is indicated by the arrow on FIGS. 1 and 5) by a solenoid 38 synchronized in its operation with the operation of the receiving and tilting member 34 (as will be further explained) so that PCBWP's 12 are admitted to the member 34 either one at a time (or in a rank of several PCBWP's extending across the delivery conveyor 14 but extending only one PCBWP deep along the length of this conveyor). As pointed out above, some PCBWP's 12 are of a width small enough to be processed two or more abreast).

Figure 4:
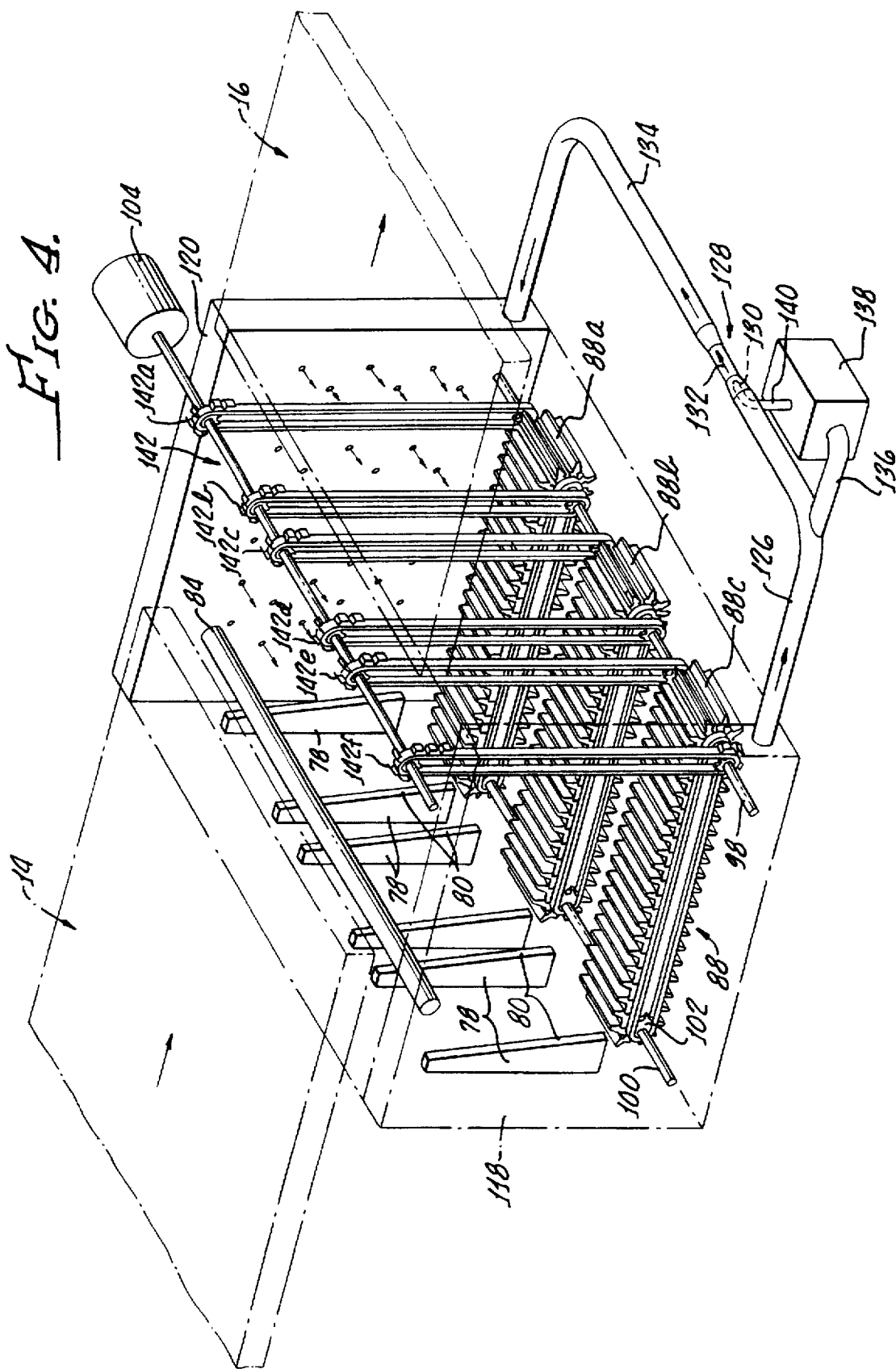

Further considering the member 34, it is seen to have a lower fork portion 40 with tines 42 extending upstream of (with respect to arrival of PCBWP's at the member 34) and between the conveyor wheels 24. The tines 42 have an upper surface 44 which in the depicted position of the member 34 (FIG. 3) is slightly below the upper extent of the conveyor wheels 24. The member 34 also includes a vertically upwardly spaced (in the position of the member 34 seen in FIG. 3) upper fork portion 46. The upper fork portion 46 has tines 48 spaced from the tines of the portion 40 so as to define a gap 50 horizontally aligned with the PCBWP's arriving along the delivery conveyor 14 in the position of the member 34 seen in FIG. 4. At the opposite end of the gap 50, the member 34 carries a movable roller stop member 52. The member 52 is carried by a pair of support arms 54 (only one of which is visible in FIG. 3) pivotally attaching to the lower fork portion 40 of the member 34. Each of the arms 54 is pivotally attached to the lower fork portion 40 by a respective pivot pin 56.

Consequently, when the blocking member 36 is lowered by the solenoid 38 to admit one PCBWP 12 (or one rank of PCBWP's) to the receiving and tilting member 34, the PCBWP proceeds along the conveyor portion 30 into the gap 50 defined by the member 34, and stops with its forward edge against the roller stop member 52. As is seen in FIGS. 1 and 3, the receiving and tilting member 34 is pivotal about a pivot axis 58 by an actuator 60 from the essentially horizontal position seen in solid lines in FIGS. 1 and 3 to the dashed-line elevated position seen in FIG. 1. The actuator 60 is best seen in FIG. 3.

As is seen in FIGS. 1, 3, and 6, the support arms 54 include a leg portion 62 depending generally perpendicularly to these support arms and the receiving and tilting member 34. Disposed below the delivery and removal conveyors 14 and 16, is a tank member 64 holding the treatment liquid 20. This tank member 64 has side walls 66, a bottom wall 68, and legs 70 which support the tank member 64 from a floor 72. Secured to one side wall 66 below the delivery conveyor 14 is an actuator block 74. When the receiving and tilting member 34 tilts toward the elevated position seen in dashed lines in FIG. 1, the leg portions 62 of the support arms 34 at an end surface 76 thereof contact the actuator block 74, pivoting the support arms 34 and roller stop member 52 out of alignment with the gap 50 (as is best seen in FIG. 6).

As is seen in FIGS. 1 and 6, and as indicated by the arrow 77, the receiving and tilting member 34 pivots through an angle of somewhat more than 90 degrees from its horizontal first position, slightly past the vertical position, and to a substantially-vertical elevated second position which is angulated slightly toward the adjacent one of the side walls 66. As the roller stop member 52 is moved out of the way of gap 50, the PCBWP 12 within the gap 50 drops out by its own weight under the influence of gravity to fall edge first into the treatment liquid bath 20. The PCBWP 12 is angulated slightly toward the adjacent side wall 66 of the tank member 64, but is in a substantially vertical position. Attached on the tank member 64 adjacent to this side wall 66 and below the receiving and tilting member 34 is a plurality of wedge-shaped guide members 78 (being best illustrated in FIG. 4). Each guide member 78 defines a respective angulated guide surface 80.

As is indicated by the curved arrow 82 (viewing FIGS. 1, 2, 3 and 6, and also now considering FIG. 4), the PCBWP drops out of the member 34 and into the chemical treatment liquid 20 edge first and angulated such that it travels substantially along its own plane into engagement with the guide surfaces 80. In order to insure that the PCBWP's 12 move into facial engagement with the guide surfaces 80 in the liquid 20, the device 18 also includes a spray bar 84 extending from side to side of the tank member 64 immersed in the liquid 20, and adjacent to but spaced from the guide surfaces 80. This spray bar 84 provides a multitude of spaced apart and generally downwardly directed liquid jets 86, which are also angulated toward the guide surfaces 80. Under the combined influences of its own weight, the angulation from the vertical caused by the angulation of the tilting member 34 at the moment the PCBWP 12 is released into the liquid 20, and of the local liquid flow occasioned by jets 86, the PCBWP 12 is urged into engagement with the guide surfaces 80 as it sinks of its own weight toward the bottom of tank 64. It will be noted in this respect that the weight of the PCBWP's is such that they are not buoyed up by the liquid 20.

Further considering FIGS. 1–4, and FIG. 7 as well, it is seen that below the guide surfaces 80 and generally along the lower extent of the tank member 64, the device 18 includes a multi-span chain type of conveyor 88. This conveyor 88 includes in the present instance three laterally spaced apart and parallel spans 88a, 88b, and 88c of link conveyor chain 90 (best seen in FIGS. 4 and 7). The link conveyor chains 90 include plural laterally elongate linked blocks 92, each having an upstanding laterally elongate somewhat wedge-shaped tooth 94. Each tooth 94 is aligned with the other such teeth of the spans 88a, 88b, and 88c. Between the adjacent teeth 94 of the conveyors 88, is cooperatively defined a somewhat V-shaped groove 96. The grooves 96 of each of the three conveyor spans 88 are aligned with one another. In order to dispose and drive the conveyor 88 adjacent to the bottom wall 68 of the tank 64, a pair of laterally-extending shafts 98, 100 are journaled within this tank 64. Each of the shafts 98, 100 carries respective sprockets 102 for the chain 90, and one of the shafts 98, 100 is powered by a drive motor 104, seen schematically in FIG. 4. The driving connection between motor 104 and shaft 98 will be further explained below. In order to support and guide the upper span of the chain 90 as it extends between and circulates around the sprockets 102, a respective guide plate 106 is received within each of the chains 90.

Accordingly, as is seen viewing FIGS. 1 and 7, as the PCBWP's sink into the liquid 20 below the receive and tilt mechanism 32, and along the guide surfaces 80, the lower edge of these PCBWP's falls into one of the grooves 96, and each PCBWP is supported by the adjacent teeth 94 in a generally vertical orientation. Because the PCBWP's enter the liquid at sequential times while the conveyor 88 runs continuously at a relatively slow speed, the PCBWP's are spaced apart on this conveyor 88. Also, because the conveyor 88 may receive PCBWP's at random times, it defines a linearly continuous series of alternating teeth 94 and grooves 96. Thus, there is no need to synchronize any part of the device 18 with the arrival of PCBWP's 12 along delivery conveyor 14. It is sufficient that the receive and tilt mechanism 32 simply takes the PCBWP's 12 seriatim individually or in ranks of one abreast. As is seen in FIGS. 1 and 7 and depicted by the arrows 108, the PCBWP's are subsequently moved along the tank 64 in liquid 20 in a face-on orientation with respect to their direction of movement.

Further considering the tank 64, it is seen that a cover member 110 is supported at substantially the same level as the upper surface 112 of the liquid 20. This cover member 110 extends from side to side of the tank 64, and extends from substantially the spray bar 84 to within a short distance of the opposite end of the tank 64. Consequently, only small portions of the liquid 20 are exposed to the ambient air. One of these portions 114 is below the receive and tilt mechanism 32 to receive the PCBWP's, and a similarly small area 116 is defined at the opposite end of tank 64. This relatively small exposed area of the liquid 20 has important advantages in reducing oxidation and aeration of the liquid 20. As is best seen viewing FIGS. 2 and 4, the tank 64 also includes a pair of laterally opposed manifolds 118 and 120. These manifolds 118, 120 extend substantially from end to end of the tank 64, and from adjacent the bottom wall 68 to the level of the top surface 112 of the liquid 20.

Each manifold 118 and 120 includes an array of apertures 122, 124, respectively, which are visible in some of the drawing Figures, or are indicated by liquid flow arrows bearing these reference numbers in other of the drawing Figures. The apertures 122, 124 respectively open between the manifolds 118, 120 and the interior of tank 64. In order to maintain a substantially uniform transverse liquid flow field from side to side and top to bottom of the tank 64, as is indicated in FIG. 2 by the liquid flow arrows 122, 124 associated with the apertures in manifolds 118, 120, manifold 118 is communicated by an aspiration conduit 126 to the inlet of a liquid-jet eductor 128. This liquid-jet eductor 128 includes a high-pressure nozzle 130 providing a jet 132 of liquid directed toward a discharge conduit 134. The conduit 134 communicates with manifold 120.

In order to provide liquid for the jet 132, a branch conduit 136 from aspiration conduit 126 leads to the inlet of a high pressure pump 138. A discharge line 140 from this pump 138 communicates pressurized liquid to the nozzle 130. Accordingly, it is seen that because of the transverse flow field of liquid 20 provided in the tank 64 between manifolds 118 and 120 by the array of apertures 122, 124, as the PCBWP's 12 are moved along the length of this tank by the conveyor 88, a fresh supply of active chemical liquid 20 is continuously provided along the faces of the PCBWP's 12. Further, because the PCBWP's 12 move in face-on orientation relative to the liquid 20, fresh liquid is urged by their own movement through any holes or apertures of the work pieces to insure treatment of the surfaces of these holes or apertures. The pump 138 also supplies pressurized liquid to spray bar 84 (via a conduit which is not illustrated in the drawing Figures) in order to provide the jets 86.

Considering now FIGS. 1, 2, 4, and 7, it is seen that the device 18 also includes a multi-span chain type elevator conveyor 142. This elevator conveyor 142 includes in the present instance six laterally spaced apart and parallel spans 142a–142f, of each link conveyor chain 144 (best seen in FIGS. 1 and 4). The link conveyor chains 144 include plural linked blocks 146, each having an outwardly extending dog-leg (i.e., somewhat L-shaped) clip member 148. Each clip 148 cooperates with the respective block 146 to define a recess 149 into which the lower edge of a PCBWP 12 is receivable. Each of the clip members 148 of the spans 142a–142f are aligned with one another laterally across the device 18. In order to drive the elevator conveyor 142, the device 18 journals a shaft 150. This shaft 150 carries a plurality of laterally spaced apart sprockets 152 which drivingly engage the chains 142, and which is drivingly connected with the drive motor 104, as is illustrated in FIG. 1. The chains 142 also drivingly engage a similar plurality of sprockets 154 which are carried upon and drive the shaft 98.

Thus, it is seen that the chain conveyors 88 and 142 are interdigitated and drivingly connected together at shaft 98.

Further, motor 104 drives shaft 150, sprockets 152, chains 144, sprockets 154, shaft 98, sprockets 102, and chains 90, in that order of power transfer. Accordingly, it is further seen that the conveyor chains 90 and 144 are synchronized with one another, although they need not run at the same linear velocity. As is illustrated by the arrow 156 in FIG. 7, the conveyor chains 144 and clips 148 run up the conveyor 142 on the side of this conveyor facing the approach of PCBWP's 12 along conveyor 88.

Viewing FIGS. 1 and 7 again, it is seen that as the PCBWP's 12 are moved along the conveyor 88 and approach the conveyor 142, the bottom edge of each PCBWP is picked up out of the respective groove 96 in which it has been disposed between teeth 94 of conveyor 88, and is supported in one or more of the recesses 149 of the clips 148 on the chains 144. Because the conveyors 88 and 142 include several spans of conveyor chains disposed in parallel spaced apart relation across the width of the tank 64, PCBWP's of a variety of widths may be processed in the device 18 without adjustment. That is, wide PCBWP's will engage all of the conveyor chains 144, while narrower PCBWP's will be engaged by at least two of the conveyor chains to insure secure lifting of these narrower PCBWP's up out of the bath of liquid 20. These various sizes of PCBWP's can be mixed together for processing, substantially without adjustments of the device 18, it is believed.

Further viewing FIGS. 1 and 7, when a PCBWP 12 is elevated by the elevating conveyor 142 to a level at which the clips 148 supporting the bottom edge of this PCBWP approaches and then begin to go over the top of sprockets 152, the PCBWP 12 will be "flopped" over the top of the shaft 150 and onto the removal conveyor 16, as is depicted by arcuate arrow 158 of FIGS. 1 and 7. Because the speed of movement of the conveyor 142 is relatively slow, and the PCBWP's 12 have a considerable facial frontal area and air resistance, this "flopping" motion is not violent and does not damage the PCBWP's 12. However, it will be noted that the wheels 24 of the conveyors 24 and 16 ordinarily have rubber treads at their perimeter, which rubber tread may further cushion the arrival of the PCBWP's on the conveyor 16. Additionally, arrow 160 of FIG. 7 illustrates that the flopping motion of the PCBWP's onto the removal conveyor 16 includes a velocity component outwardly of the clips 148 and along the horizontal run of the conveyor 16. This horizontal component of velocity is helpful in removing the PCBWP's from the clips 148.

Turning now to FIGS. 8–11, an alternative embodiment of the invention is depicted. In order to obtain reference numerals for use in describing the embodiment of FIGS. 8–11, features which are the same or which are analogous in structure or function are referenced with the same numeral used above, and having a prime (') added. Viewing FIGS. 8–11 in conjunction, it is seen that as PCBWP's 12 proceed along delivery conveyor 14' they reach a termination portion 30', which termination portion 30' is seen at the left-hand side of FIGS. 8 and 9. Here the PCBWP's may be momentarily stopped by the blocking member 36' actuated by solenoid 38'. However, at a moment determined by a sensor 162 (to be further explained), the blocking member 36' is withdrawn by solenoid 38, and the PCBWP's 12 proceed along conveyor 14', as indicated by arrow 164. Consequently, the leading edge 166 of each PCBWP 12' is caught in a gap 168 of clip members 170 carried on spaced apart chain blocks 172. These chain blocks 172 are part of a conveyor chain 174 (viewing FIG. 7). The conveyor chain 174 seen in FIG. 7 is one of six such conveyor chains 174a–174f (only four of which 174c–174f are seen in FIG. 10) comprising a receiving and immersion conveyor 176. As is seen in FIG. 8, the receiving and immersion conveyor 176 is angulated in its descent into the liquid 20'. As will be seen, the PCBWP's 12' are consequently maintained in a substantially vertical face-on orientation.

The conveyor chains 174 are seen in FIG. 10 to be interdigitated with the chains of conveyor 88' (as was the case with elevating conveyor chains 144 described above). Consequently, although only four of the six conveyor chains 174a–174f are seen in FIG. 10, it will be understood that the remaining un-depicted chains and structure is represented by the typical structure illustrated in this drawing Figure, and has similarities to the elevator conveyor 142 (which by now is familiar to the reader). The chains 174 are driven by respective sprockets 178 carried on shaft 100, and are trained over respective sprockets 180 drivingly carried on a rotational shaft 182. The shaft 182 is journaled on the device 18'. Further, shaft 182 carries a code wheel 184 (illustrated in phantom in FIG. 7) having apertures 186 aligning with the positions of clips 170 as these pass with chain 174 around the sprockets 180. The sensor 162 responds to the apertures 186 by actuating solenoid 38' and withdrawing blocking member 36', with a lead time being allowed for the movement of a PCBWP from blocking member 36' into the gap 168 as the clips 170 are positioned as seen in FIG. 7 to receive the edge 166.

Accordingly, from the position of the horizontally disposed PCBWP 12' seen in FIG. 9 with its edge 166 in clips 170, as the chains 174 proceed over the top of sprockets 180, the PCBWP 12' is levered up about the shaft 182 and is lifted upwardly at its trailing edge off of the receiving conveyor 14, with the trailing edge moving arcuately through a movement preferably of no more than 90° (as is depicted in FIGS. 8 and 9 by arrow 188). Subsequently, the PCBWP's 12' are supported at their lower edges 166 in the clips 170 as the chain conveyor 176 immerses these PCBWP's 12' into the chemical treatment liquid 20', as is depicted by arrow 190. As was mentioned before, the receiving and immersion conveyor 176 includes conveyor chains 174 which are interdigitated and driven in synchronization with the conveyor 88'. Accordingly, when a PCBWP 12' reaches the bottom of conveyor 176, the bottom edge 166 is received in a groove 96', disengages from the clips 170, and is moved by the conveyor 88' in substantially vertical face-on orientation along the tank 64' much as was described earlier.

However, with the device 18' it is known that the PCBWP's 12' do not arrive at random times in relation to the positions of grooves 96' and teeth 94'. Accordingly, the conveyor 88' may include some blocks 92' without teeth 94', if desired. That is, the blocks 92 of conveyor 88' which are provided with teeth 94' defining grooves 96' may be just those which align with a clip 70 at the position of interchange of the PCBWP's 12' between conveyors 176 and 88'. The balance of the structure and operation of device 18' is the same as that described above for device 18.

In order to complete this description of the devices 18 and 18' seen in FIGS. 1–11, it should be noted viewing FIGS. 1 and 8 that the devices 18 or 18' may include an immersion heating element 192 (192'). These heating elements are effective to maintain a supra-ambient temperature of the chemical liquid 20 (20'), thus improving its chemical activity.

While the present invention has been depicted, described, and is defined by reference to two particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

We claim:

1. Apparatus for chemically treating surfaces of a panel-like planar printed circuit board work piece (PCBWP), said apparatus comprising:

receiving means for receiving a PCBWP in a horizontal orientation and moving the PCBWP to a substantially vertical orientation;

tank means for holding a bath of chemical treatment liquid;

immersion means for moving the PCBWP in the substantially vertical orientation from said receiving means into said bath of chemical treatment liquid;

conveyor means submerged in said bath of chemical treatment liquid for supporting and moving the PCBWP in the substantially vertical orientation horizontally along said tank substantially perpendicularly to the plane of the PCBWP;

elevator means for receiving the PCBWP from said conveyor means and elevating the PCBWP in said substantially vertical orientation upwardly out of said bath of chemical treatment liquid.

2. The apparatus of claim 1 wherein said apparatus further includes fluid flow means for maintaining a substantially uniform transverse flow of said treatment liquid from side to side of said tank while the PCBWP's are submerged therein.

3. The apparatus of claim 2 wherein said fluid flow means for maintaining a substantially uniform transverse flow of said treatment liquid from side to side of said tank includes a pair of opposed manifolds each disposed at a respective side of said tank and extending along the length thereof and vertically an extent substantially equal to a length dimension of said PCBWP, each of said pair of manifolds defining a respective array of apertures opening between an interior of said manifold and said tank, and liquid pumping means interconnecting said pair of manifolds for receiving liquid via said respective array of apertures from said tank into one of said pair of manifolds and delivering this liquid pressurized to the other of said pair of manifolds for flow therefrom via said array of respective apertures then across said tank as a substantially uniform flow field and to the one manifold.

4. The apparatus of claim 1 wherein said receiving means includes a tilting mechanism pivotally disposed above said tank, said tilting mechanism defining a gap in a first position horizontally aligned with a delivery conveyor for receiving a PCBWP therefrom in a horizontal orientation into said gap with a leading end edge thereof stopped against a blocking member of said tilting mechanism, said tilting mechanism pivoting to a second position at least substantially 90° from said first position with the PCBWP in said vertical orientation and with said leading end edge thereof being lowermost and disposed toward said treatment liquid.

5. The apparatus of claim 1 wherein said conveyor means comprises a continuous conveyor belt.

6. The apparatus of claim 1 further comprising repositioning means for repositioning the PCBWP from said elevator means, from the substantially vertical orientation to a substantially horizontal orientation, for conveyance generally away from said tank means.

7. The apparatus of claim 1 further comprising means for flopping the PCBWP elevated by said elevator means to a horizontal orientation for conveyance away from said tank means.

8. Apparatus for chemically treating surfaces of a panel-like planar printed circuit board work piece (PCBWP), said apparatus comprising:

receiving means for receiving a PCBWP in a horizontal orientation and moving the PCBWP to a substantially vertical orientation;

tank means for holding a bath of chemical treatment liquid;

immersion means for moving the PCBWP in the substantially vertical orientation from said receiving means into said bath of chemical treatment liquid;

conveyor means submerged in said bath of chemical treatment liquid for supporting and moving the PCBWP in the substantially vertical orientation horizontally along said tank substantially perpendicularly to the plane of the PCBWP;

elevator means for receiving the PCBWP from said conveyor means and elevating the PCBWP in said substantially vertical orientation upwardly out of said bath of chemical treatment liquid;

wherein said receiving means includes a tilting mechanism pivotally disposed above said tank, said tilting mechanism defining a gap in a first position horizontally aligned with a delivery conveyor for receiving a PCBWP therefrom in a horizontal orientation into said gap with a leading end edge thereof stopped against a blocking member of said tilting mechanism, said tilting mechanism pivoting to a second position at least substantially 90° from said first position with the PCBWP in said vertical orientation and with said leading end edge thereof being lowermost and disposed toward said treatment liquid;

wherein said immersion means includes said blocking member of said receiving means being movably carried upon said tilting mechanism, said stop member including an actuator feature engagable with an actuator block of said tank upon said tilting mechanism reaching said second position to move said blocking member away from said end edge of the PCBWP, allowing the PCBWP to drop of its own weight edge-first into said treatment liquid.

9. The apparatus of claim 8 wherein said immersion means further includes said tank at one end thereof including a guide member defining an angulated guide surface extending downwardly into said tank and toward which said tilting mechanism in said second position thereof generally directs the PCBWP edge-first as the latter drops from said tilting mechanism into said bath of treatment liquid, and a liquid spray means immersed in said treatment liquid and spaced from said guide member and opposite thereto with respect to a place of entry of the PCBWP into said treatment liquid, said liquid spray means providing a plurality of liquid jets directed downwardly and toward said guide member and urging the PCBWP into engagement with said guide surface of said guide member to slide therealong as the PCBWP sinks of its own weight into said treatment liquid.

10. The apparatus of claim 9 wherein said liquid spray means includes a spray bar immersed in said treatment liquid adjacent to an upper surface thereof and spaced from said guide member opposite to said place of entry of the PCBWP's from said tilting mechanism in said second position thereof into said treatment liquid.

11. The apparatus of claim 9 wherein said conveyor means includes a chain of links having laterally extending teeth in pairs spaced apart to define a laterally extending groove aligning with a lower edge of said guide member, said groove receiving a lower edge of the PCBWP as the latter sinks into said treatment liquid by its own weight along said guide surface, said pair of spaced apart teeth engaging and supporting the PCBWP in a substantially vertical orientation within said bath of treatment liquid, and means for advancing said chain of links from one end of said tank toward the opposite end thereof with the PCBWP in face-on orientation relative to movement thereof through said treatment liquid, whereby movement of the PCBWP face-on through said treatment liquid urges the latter through any through holes or apertures of the PCBWP.

12. The apparatus of claim 11 wherein said conveyor means includes plural such chains of links each having laterally extending teeth in pairs spaced apart to define a respective laterally extending groove aligning with a lower edge of said guide member, said grooves of each of said plural chains of said conveyor means aligning laterally with one another, whereby a lower edge of a PCBWP wide enough to engage more than one of said plural chains of links is received at said lower edge thereof into two or more of said grooves to be supported therein by said pairs of teeth in cooperation.

13. The apparatus of claim 11 wherein said means for advancing said chain of links from one end of said tank toward the opposite end thereof with the PCBWP in face-on orientation relative to movement thereof through said treatment liquid includes a pair of laterally extending shafts disposed one adjacent to said one end of said tank and the other adjacent to said opposite end of said tank, said pair of laterally extending shafts each carrying a respective one of a pair of tandem sprockets, said chain of links being trained over and drivingly engaging said tandem sprocket pair, and power drive means drivingly connecting with one of said pair of laterally extending shafts.

14. The apparatus of claim 13 wherein said chain of links is formed into a loop trained about said tandem sprocket pair, a guide plate extending between said pair of laterally extending shafts and having an upper surface slidably supporting an upper span of said looped chain of links.

15. The apparatus of claim 9 wherein said conveyor means includes:
a horizontal chain of links having laterally extending teeth in pairs spaced apart to define a laterally extending groove aligning with a lower edge of said guide member, said groove receiving a lower edge of the PCBWP as the latter sinks into said treatment liquid by its own weight along said guide surface, said pair of spaced apart teeth engaging and supporting the PCBWP in a substantially vertical orientation within said bath of treatment liquid;
a pair of laterally-extending horizontally-spaced shafts disposed one adjacent to said one end of said tank and the other adjacent to said opposite end of said tank, said pair of horizontally-spaced shafts each carrying a respective one of a pair of tandem sprockets, said chain of links being formed into a loop trained about said pair of tandem sprockets, a guide plate extending between said pair of horizontally-spaced shafts and having an upper surface slidably supporting an upper span of said looped chain of links;
said elevator means including a second chain of links extending in a generally vertical direction from adjacent said other shaft upwardly out of said bath of treatment liquid to a third shaft spaced vertically above said other shaft, said second chain of links including spaced apart block members each carrying a respective one of a plurality of generally L-shaped clips, said L-shaped clips each defining a respective recess into which a lower edge of a PCBWP is receivable to support the latter, said other shaft and said third shaft each carrying a respective one of another pair of tandem sprockets, and said second chain of links being looped and trained over said another pair of tandem sprockets to drivingly engage the latter, and power drive means drivingly connecting with said third shaft;
whereby movement of the PCBWP on said conveyor means face-on through said treatment liquid urges the latter through any through holes or apertures of the PCBWP.

16. The apparatus of claim 15 wherein said conveyor means includes plural such horizontal chains of links, said elevator means similarly including plural second chains of links extending from said other shaft upwardly out of said bath of treatment liquid to said third shaft, and said plural horizontal chains of links of said conveyor means interdigitating at said other shaft with said plural second chains of links of said elevator means.

17. Apparatus for chemically treating surfaces of a panel-like planar printed circuit board work piece (PCBWP), said apparatus comprising:
receiving means for receiving a PCBWP in a horizontal orientation and moving the PCBWP to a substantially vertical orientation;
tank means for holding a bath of chemical treatment liquid;
immersion means for moving the PCBWP in the substantially vertical orientation from said receiving means into said bath of chemical treatment liquid;
conveyor means submerged in said bath of chemical treatment liquid for supporting and moving the PCBWP in the substantially vertical orientation horizontally along said tank substantially perpendicularly to the plane of the PCBWP;
elevator means for receiving the PCBWP from said conveyor means and elevating the PCBWP in said substantially vertical orientation upwardly out of said bath of chemical treatment liquid;
wherein said elevator means for receiving the PCBWP from said conveyor means and elevating the PCBWP in said substantially vertical orientation upwardly out of said bath of chemical treatment liquid includes a chain of links extending in a generally vertical direction from adjacent an end of said conveyor means upwardly out of said bath of treatment liquid, said chain of links including spaced apart block members each carrying a respective one of a plurality of generally L-shaped clips, said L-shaped clips each defining a respective recess into which a lower edge of a PCBWP is receivable to support the latter, and means for moving said chain of links upwardly out of said bath of chemical treatment liquid.

18. The apparatus of claim 17 wherein said means for moving said chain of links upwardly out of said bath of chemical treatment liquid includes a pair of laterally extending vertically spaced shafts disposed one adjacent to said opposite end of said tank at a respective end of said conveyor means to receive PCBWP's therefrom and the other above an upper surface of said bath of chemical treatment liquid, said pair of vertically spaced shafts each carrying a respective one of a pair of tandem sprockets, and said chain of links being trained over and drivingly engaging said tandem sprocket pair, and power drive means drivingly connecting with one of said pair of vertically spaced shafts.

19. Apparatus for chemically treating surfaces of a panel-like planar printed circuit board work piece (PCBWP), said apparatus comprising:

receiving means for receiving a PCBWP in a horizontal orientation and moving the PCBWP to a substantially vertical orientation;

tank means for holding a bath of chemical treatment liquid;

immersion means for moving the PCBWP in the substantially vertical orientation from said receiving means into said bath of chemical treatment liquid;

conveyor means submerged in said bath of chemical treatment liquid for supporting and moving the PCBWP in the substantially vertical orientation horizontally along said tank substantially perpendicularly to the plane of the PCBWP;

elevator means for receiving the PCBWP from said conveyor means and elevating the PCBWP in said substantially vertical orientation upwardly out of said bath of chemical treatment liquid;

wherein said elevator means further includes means for returning a PCBWP from said substantially vertical orientation to a horizontal orientation and delivery of the PCBWP onto a conveyor for transport thereof, said means for returning including said L-shaped clips supportingly engaging a lower edge of a PCBWP as said clips rotate around an upper one of said tandem sprockets, thereby to arcuately move said PCBWP into a horizontal orientation with a "flopping" motion generally about the lower edge of the PCBWP.

20. Apparatus for chemically treating surfaces of a panel-like planar printed circuit board work piece (PCBWP), said apparatus comprising:

receiving means for receiving a PCBWP in a horizontal orientation and moving the PCBWP to a substantially vertical orientation;

tank means for holding a bath of chemical treatment liquid;

immersion means for moving the PCBWP in the substantially vertical orientation from said receiving means into said bath of chemical treatment liquid;

conveyor means submerged in said bath of chemical treatment liquid for supporting and moving the PCBWP in the substantially vertical orientation horizontally along said tank substantially perpendicularly to the plane of the PCBWP;

elevator means for receiving the PCBWP from said conveyor means and elevating the PCBWP in said substantially vertical orientation upwardly out of said bath of chemical treatment liquid;

wherein said receiving means and said immersion means includes a receiving and immersion conveyor, said receiving and immersion conveyor including a vertically and horizontally spaced pair of laterally extending shafts, each one of said pair of shafts carrying a respective one of a pair of tandem sprockets, a chain of links including block members each carrying a clip member defining a gap, said chain of links being formed into a loop trained over said pair of tandem sprockets so that a leading edge of a PCBWP in a horizontal orientation is receivable into said gap, power drive means for circulating said looped chain of links about said tandem sprockets, said chain of links circulating about said pair of tandem sprockets so that a PCBWP in said horizontal orientation is receivable at a leading edge thereof into said gap of a clip at an upper one of said pair of vertically and horizontally spaced shafts, said clip rotating about said upper shaft with said chain of links to lever said PCBWP about said upper shaft into a vertical orientation, and said chain of links including a span descending angularly into said bath of chemical treatment liquid and carrying said PCBWP downwardly in said substantially vertical orientation to immerse the latter in said chemical treatment liquid.

21. Apparatus for chemically treating surfaces of a panel-like planar printed circuit board work piece (PCBWP), said apparatus comprising:

receiving means for receiving a PCBWP in a horizontal orientation and moving the PCBWP to a substantially vertical orientation;

tank means for holding a bath of chemical treatment liquid;

immersion means for moving the PCBWP in the substantially vertical orientation from said receiving means into said bath of chemical treatment liquid;

conveyor means submerged in said bath of chemical treatment liquid for supporting and moving the PCBWP in the substantially vertical orientation horizontally along said tank substantially perpendicularly to the plane of the PCBWP;

elevator means for receiving the PCBWP from said conveyor means and elevating the PCBWP in said substantially vertical orientation upwardly out of said bath of chemical treatment liquid;

wherein said conveyor means includes:

a horizontal chain of links having laterally extending teeth in pairs spaced apart to define a laterally extending groove aligning with a lower edge of said guide member, said groove receiving a lower edge of the PCBWP as the latter sinks into said treatment liquid by its own weight along said guide surface, said pair of spaced apart teeth engaging and supporting the PCBWP in a substantially vertical orientation within said bath of treatment liquid;

a pair of laterally-extending horizontally-spaced shafts disposed one adjacent to said one end of said tank and the other adjacent to said opposite end of said tank, said pair of horizontally-spaced shafts each carrying a respective one of a pair of tandem sprockets, said chain of links being formed into a loop trained about said pair of tandem sprockets, a guide plate extending between said pair of horizontally-spaced shafts and having an upper surface slidably supporting an upper span of said looped chain of links; and power drive means drivingly connecting with said horizontally-spaced pair of shafts;

said receiving means and said immersion means including a receiving and immersion conveyor, said receiving and immersion conveyor including a third shaft spaced both vertically and horizontally with respect to said one of said horizontally-spaced pair of shafts of said conveyor means; each one of said one shaft and said third shaft carrying a respective one of another pair of tandem sprockets, another chain of links including block members each carrying a clip member defining a gap, said another chain of links being formed into a loop trained over and drivingly engaging said another pair of tandem sprockets so that said chain of links and said another chain of links are drivingly connected via said one shaft and so that a leading edge of a PCBWP in a horizontal orientation is receivable into said gap of a clip on said another chain of links as said clip is situated atop said third shaft, and said another chain of links circulating about said pair of tandem sprockets so that a PCBWP in said horizontal orientation and received at a leading edge thereof into said gap of a clip at said third shaft levers said PCBWP about said third shaft into a vertical orientation, and said another chain of links including a span descending angularly into said bath of chemical treatment liquid to said one shaft and carrying said PCBWP downwardly in said substantially vertical orientation to immerse the latter in said chemical treatment liquid.

22. The apparatus of claim 21 wherein said conveyor means includes plural such horizontal chains of links, said receiving and immersion conveyor similarly including plural such another chain of links extending from said third shaft downwardly into said bath of treatment liquid to said one shaft, and said plural horizontal chains of links of said conveyor means interdigitating at said one shaft with such plural another chain of links of said receiving and immersion conveyor.

23. Apparatus for chemically treating surfaces of a panel-like planar printed circuit board work piece (PCBWP), said apparatus comprising:
receiving means for receiving a PCBWP in a horizontal orientation and moving the PCBWP to a substantially vertical orientation;
tank means for holding a bath of chemical treatment liquid;
immersion means for moving the PCBWP in the substantially vertical orientation from said receiving means into said bath of chemical treatment liquid;
conveyor means submerged in said bath of chemical treatment liquid for supporting and moving the PCBWP in the substantially vertical orientation horizontally along said tank substantially perpendicularly to the plane of the PCBWP;
elevator means for receiving the PCBWP from said conveyor means and elevating the PCBWP in said substantially vertical orientation upwardly out of said bath of chemical treatment liquid;
wherein said conveyor means comprises a continuous conveyor belt;
wherein said conveyor means includes spaced teeth on said conveyor belt defining grooves therebetween for receiving therein a lower end of the PCBWP.

24. Apparatus for chemically treating surfaces of a panel-like planar printed circuit board work piece (PCBWP), said apparatus comprising:
receiving means for receiving a PCBWP in a horizontal orientation and moving the PCBWP to a substantially vertical orientation;
tank means for holding a bath of chemical treatment liquid;
immersion means for moving the PCBWP in the substantially vertical orientation from said receiving means into said bath of chemical treatment liquid;
wherein said conveyor means includes spaced slots for receiving lower ends of the PCBWPs and conveying them generally across said tank means;
conveyor means submerged in said bath of chemical treatment liquid for supporting and moving the PCBWP in the substantially vertical orientation horizontally along said tank substantially perpendicularly to the plane of the PCBWP;
elevator means for receiving the PCBWP from said conveyor means and elevating the PCBWP in said substantially vertical orientation upwardly out of said bath of chemical treatment liquid;
wherein said conveyor means includes receiving slots for receiving a lower end of a PCBWP and conveying it generally across said tank means.

25. Apparatus for chemically treating surfaces of a panel-like planar printed circuit board work piece (PCBWP), said apparatus comprising:
receiving means for receiving a PCBWP in a horizontal orientation and moving the PCBWP to a substantially vertical orientation;
tank means for holding a bath of chemical treatment liquid;
immersion means for moving the PCBWP in the substantially vertical orientation from said receiving means into said bath of chemical treatment liquid;
conveyor means submerged in said bath of chemical treatment liquid for supporting and moving the PCBWP in the substantially vertical orientation horizontally along said tank substantially perpendicularly to the plane of the PCBWP;
elevator means for receiving the PCBWP from said conveyor means and elevating the PCBWP in said substantially vertical orientation upwardly out of said bath of chemical treatment liquid;
wherein said elevator means includes means for receiving therein a lower end of the PCBWP and for lifting the PCBWP out of said bath.

26. Apparatus for chemically treating surfaces of a panel-like planar printed circuit board work piece (PCBWP), said apparatus comprising:
receiving means for receiving a PCBWP in a horizontal orientation and moving the PCBWP to a substantially vertical orientation;
tank means for holding a bath of chemical treatment liquid;
immersion means for moving the PCBWP in the substantially vertical orientation from said receiving means into said bath of chemical treatment liquid;
conveyor means submerged in said bath of chemical treatment liquid for supporting and moving the PCBWP in the substantially vertical orientation horizontally along said tank substantially perpendicularly to the plane of the PCBWP;
elevator means for receiving the PCBWP from said conveyor means and elevating the PCBWP in said substantially vertical orientation upwardly out of said bath of chemical treatment liquid;
wherein said elevator means includes a substantially vertical endless conveyor belt.

27. The apparatus of claim 26 wherein said elevator means includes a plurality of PCBWP holders spaced along a length of said conveyor belt.

28. An apparatus for chemically treating surfaces of a panel-like planar printed circuit board work piece (PCBWP), said apparatus comprising:
a tank holding a bath of chemical treatment liquid, said tank having an entrance end and a discharge end;

a continuous conveyor belt submerged in said bath and having receiving slots;

depositing means for receiving a PCBWP in a horizontal orientation, and depositing the PCBWP in a substantially vertically orientation down into said bath and into one of said receiving slots and at said entrance end;

a substantially vertical conveyor having a plurality of receivers for receiving a lower end of the PCBWP at the tank discharge end conveyed thereto by said conveyor belt, and lifting the PCBWP up and generally out of said bath; and moving means for moving the PCBWP lifted by said vertical conveyor to a substantially horizontal orientation for conveyance generally away from said tank.

29. The apparatus of claim 28 wherein said depositing means drops the PCBWP down into the receiving slot.

30. The apparatus of claim 28 wherein said receivers comprise spaced clips.

31. The apparatus of claim 28 wherein said moving means flips the PCBWP over to the substantially horizontal orientation.

32. The apparatus of claim 28 further comprising fluid flow means for maintaining a substantially uniform transverse flow of the chemical treatment liquid from one side of said tank to another, while the PCBWP is on said conveyor belt.

33. A method of chemically treating surfaces of a panel-like planar printed circuit board work piece (PCBWP), said method comprising the steps of:

repositioning a PCBWP from a horizontal orientation to a substantially vertical orientation in a chemical treatment liquid bath and onto a conveyor belt submerged in the bath;

conveying via the conveyor belt the PCBWP in the substantially vertical orientation face-on through the bath along a line substantially perpendicular to the plane of the PCBWP; and after said conveying, lifting the PCBWP out of the bath.

34. The method of claim 33 wherein said conveying utilizes the face-on movement to cause movement of the chemical treatment liquid through any apertures or holes penetrating through the PCBWP.

35. The method of claim 33 further comprising during said conveying, maintaining a substantially uniform liquid flow field transverse to the direction of movement of the PCBWP through the chemical treatment liquid.

36. The method of claim 33 wherein said lifting includes lifting the PCBWP while in the substantially vertical orientation.

37. The method of claim 36 further comprising after said lifting, flipping the PCBWP over to a substantially horizontal orientation.

38. The method of claim 37 further comprising after said flipping, conveying the PCBWP generally away from the bath.

39. A method of chemically treating surfaces of a panel-like planar printed circuit board work piece (PCBWP), said method comprising the steps of:

repositioning a PCBWP from a horizontal orientation to a substantially vertical orientation in a chemical treatment liquid bath and onto a conveyor belt submerged in the bath;

conveying via the conveyor belt the PCBWP in the substantially vertical orientation face-on through the bath along a line substantially perpendicular to the plane of the PCBWP;

after said conveying, lifting the PCBWP out of the bath; and wherein said repositioning includes allowing the PCBWP to fall and sink by itself edge-wise in the bath of its own weight onto the conveyor belt.

40. A method of chemically treating surfaces of a panel-like planar printed circuit board work piece (PCBWP), said method comprising the steps of:

repositioning a PCBWP from a horizontal orientation to a substantially vertical orientation in a chemical treatment liquid bath and onto a conveyor belt submerged in the bath;

conveying via the conveyor belt the PCBWP in the substantially vertical orientation face-on through the bath along a line substantially perpendicular to the plane of the PCBWP;

after said conveying, lifting the PCBWP out of the bath; and wherein said lifting includes lifting with a substantially vertical endless belt conveyor.

41. The method of claim 40 wherein the substantially vertical belt conveyor has a plurality of holders, and said lifting includes holding a lower end of the PCBWP in one of the holders.

* * * * *